United States Patent [19]

van den Brekel

[11] 4,000,019
[45] Dec. 28, 1976

[54] METHOD OF RETAINING SUBSTRATE PROFILES DURING EPITAXIAL DEPOSITION

[75] Inventor: Cornelis Hendricus Joannes van den Brekel, Eindhoven, Netherlands

[73] Assignee: U.S. Philips Corporation, New York, N.Y.

[22] Filed: May 16, 1974

[21] Appl. No.: 470,387

[30] Foreign Application Priority Data

May 18, 1973  Netherlands ............... 7306948

[52] U.S. Cl. .................. 148/175; 29/574; 29/580; 148/187; 156/610; 156/612; 357/48; 357/60

[51] Int. Cl.² .................. H01L 21/20; H01L 21/66

[58] Field of Search .......... 148/175, 187; 117/201, 117/212, 213; 29/574, 580; 357/60, 48; 156/610, 612

[56] References Cited

UNITED STATES PATENTS

| | | | |
|---|---|---|---|
| 3,325,314 | 6/1967 | Allegretti | 148/175 |
| 3,379,584 | 4/1968 | Bean et al. | 148/175 |
| 3,476,592 | 11/1969 | Berkenblit et al. | 117/201 |
| 3,556,875 | 1/1971 | Holloway et al. | 148/175 |
| 3,636,421 | 1/1972 | Takeishi et al. | 357/60 |
| 3,697,318 | 10/1972 | Feinberg et al. | 117/212 |
| 3,728,166 | 4/1973 | Bardell et al. | 148/175 |
| 3,821,783 | 6/1974 | Sugita et al. | 357/60 |

OTHER PUBLICATIONS

Mendelson, S., "Stacking Fault Nucleation–Oriented Silicon Substrates" J. Applied Physics, vol. 35, No. 5, May 1964, pp. 1570–1581.
Tung, S. K., "Effects of Substrate Orientation on Epitaxial Growth" J. Electrochem. Soc., vol. 112, No. 4, Apr. 1965, pp. 436–438.
Sugawara, K., "Facets Formed–on Silicon Surfaces–Si₃N₄ Masks" J. Electrochem. Soc., vol. 118, No. 1, Jan. 1971, pp. 110–114.
Bean et al., "Influence of Crystal Orientation on Silicon Semiconductor Processing," Proc. IEEE, vol. 57, No. 8, Sept. 1969, pp. 1469–1476.
Drum et al., "Geometric Stability–During Growth of (111) and (100) Epitaxial Silicon" J. Electrochem. Soc., vol. 115, No. 6, June, 1968, pp. 664–669.
Boss et al., "Pattern Washout and Displacement in Silicon (111) Epitaxy" Electrochem. Soc. Extended Abstracts (Electronics Div.) vol. 15, No. 2, 1966, pp. 60–65.
Boss et al., "Crystal Orientation for Integrated Device Fabrication" IBM Tech. Discl. Bull., vol. 8, No. 12, May 1966, pp. 1710–1711.
Enomoto et al., "Pattern Washout-Epitaxial Process-Fabrication," Japanese J. of Applied Physics, vol. 8, No. 11, Nov. 1969, pp. 1301–1306.

Primary Examiner—L. Dewayne Rutledge
Assistant Examiner—W. G. Saba
Attorney, Agent, or Firm—Frank R. Trifari; Leon Nigohosian

[57]  ABSTRACT

A method of manufacturing a semiconductor device, in particular a monolithic integrated circuit, in which highly doped zones are provided according to a given pattern on one side of a monocrystalline silicon substrate body by local diffusion of at least one impurity in a substantially flat surface of the substrate body and the substrate surface on said side is given a profile in a pattern which corresponds to the pattern of the highly doped zones, after which an epitaxial silicon layer is provided on said side and one or more semiconductor circuit elements are then formed while using at least one photoresist step, characterized in that the substantially flat substrate surface is given a crystal orientation lying between a {001} face and an adjacent {111} face, which orientation deviates at least 10° from the said {001} face and at least 15° from said {111} face and is present in a strip within 10° from the crystallographic zone formed by the said two faces.

3 Claims, 9 Drawing Figures

METHOD OF RETAINING SUBSTRATE PROFILES DURING EPITAXIAL DEPOSITION

The invention relates to a method of manufacturing a semiconductor device, in particular a monolithic integrated circuit, in which highly doped zones are provided according to a given pattern on one side of a monocrystalline silicon substrate body by local diffusion of at least one impurity in a substantially flat surface of the substrate body and the substrate surface on the said side is given a profile in a pattern which corresponds to the pattern of the highly doped zones, after which an epitaxial silicon layer is provided on said side and one or more semiconductor circuit elements are formed while using at least one photoresist step. The term "photoresist step" is not to be restricted to the use of electromagnetic radiation but also comprises the use of particle radiation, for example, electron rays.

In such a known method in which the highly doped zones formed at the substrate surface are provided by means of planar techniques, the diffusion process is generally carried out in an oxidizing atmosphere, the silicon being oxidized at the locally unmasked substrate surface at the area where the highly doped zone is formed. Upon removing the mask used and the oxide formed, the silicon surface proves to be profiled, namely the semiconductor surface at the area of the formed diffusion zones lies slightly deeper than at the area of the mask.

When an epitaxial layer is provided on such a profiled substrate surface, the surface of the epitaxial layer also proves to have obtained a profile pattern the shape of which is significantly correlated with the pattern of the substrate surface. In the next photoresist step for making semiconductor devices, the photomask used is aligned on the surface pattern of the epitaxial layer, assuming that said pattern gives a more or less correct indication of the location of the zones formed in the substrate surface by diffusion. Actually it is known to use such zones, sometimes referred to as "buried zones", for insulation purposes, to reduce the series resistance between an electrode present below a p-n junction and a surface contact, or as a deep lying conductive connection. A correct location of zones formed in the epitaxial layer and contacts to be provided on the silicon relative to the said zones provided in the substrate is generally of importance.

It has been found, however, that the profile could move laterally during the epitaxial deposition. This phenomenon is sometimes referred to as "shift". Direction and value of the lateral displacement were generally not reproducible and could not be established in the resulting profile. The original profile during the epitaxial growth could even disappear entirely or fade, also referred to as "smear".

The result of these phenomena could be a wrong location of zones provided afterwards in the epitaxial layer relative to the buried highly doped zones. As a result of this, strong deviations of the desired characteristic of the semiconductor device to be manufactured and possibly even local leakage or reduced breakdown voltage could occur.

These possible errors in aligning had been taken into account by making the buried zones sufficiently wide and providing them at a sufficient distance from each other, for example, so as to ensure that a zone provided in the epitaxial layer was certainly present above a given buried layer throughout its lower side. However, other zones provided afterwards should be present at a sufficient lateral distance from such a buried zone. This again resulted in the necessity of using sufficiently large distances between juxtaposed zones diffused in the epitaxial layer. However, such measures required extra semiconductor surface area per circuit element or group of circuit elements, which was disadvantageous to obtain a maximum number of semiconductor devices from one silicon wafer.

One of the objects of the present invention is to eliminate the above-described difficulties at least for the greater part. Another object is to manufacture semiconductor devices of the type mentioned in the preamble in a more compact structure.

The basic idea for that purpose is first of all that the above-mentioned "shift" and "smear" is linked up with anisotropic growth phenomena in the epitaxial deposition. Of further importance is the fact that in manufacturing semiconductor devices of the type mentioned in the preamble silicon wafers are normally used as starting material whose surface is oriented according to a plane with simple Miller indices, namely a {100}, {110} or {111} plane, or deviates therefrom at most by a few degrees.

In epitaxially depositing silicon on a silicon single crystal, it had already been found, that the growth rates dependent on crystallographic orientation showed comparatively sharp minima on the planes having the above-mentioned low Miller indices and that the growth rates changed only slowly with the orientation on planes having intermediately located orientations, the maxima being comparatively flat.

Another idea underlying the present invention is that the above-mentioned "shift" and "smear" phenomena are linked up with the above-mentioned sharp minima in the growth rate with orientations with low Miller indices. It has furthermore been established that the profiled surface consists for the greater part of flat parts with a small height difference which has the same orientation equal to that of the original substrate surface, and intermediately located narrow edge portions the orientations of which, at least after a first beginning of the deposition, deviate only over a small angle from the original orientation of the substrate surface, namely smaller than 10°, for example approximately 5°.

The original orientation of a substrate surface can be obtained in known manner. For example, silicon single crystals in rod form can be obtained from melted silicon, for example, by drawing from a previously oriented seed crystal or by floating zone melting, a molten zone being passed through a silicon rod from a previously oriented seed crystal. Such monocrystalline silicon rods may then be divided in known manner into wafers having surfaces in the desired orientation.

The orientation of the substrate surface is to be understood to mean hereinafter the orientation of the above-mentioned flat parts having the same orientation of which the profiled substrate surface consists for the greater part. This orientation corresponds to the average orientation of said substantially flat surface. When said orientation corresponds with or encloses a very small angle with a crystal face direction with low Miller indices, where a sharp minimum of the growth rate occurs, the dependence of the growth rate on the orientation is large. As a result of this it will be possible that considerable differences in the growth rate of the differently oriented parts of the profiled surface occur. As will be described in greater detail hereinafter with reference to the accompanying drawing, this may involve uncontrollable lateral shifts and/or smears of the edge parts which provide a wrong image or no image at all of the location of buried zones formed in the substrate surface by diffusion. In series production the problem occurs moreover that with normal very small variations in the orientations of the substrate used quite different phenomena as regards shift or displacements may occur.

By choosing the orientation of the substrate surface to be sufficiently far from such crystal face orientations with sharp minima, the growth rates on the differently oriented parts of the substrate surface will vary little so that shifts of the edge portions with epitaxial growth can occur at most to a small extent only. A further consideration for the present invention is that the {001} faces and the nearest {111} faces enclose a comparatively large angle of approximately 55°. It is therefore advantageous to choose the orientation approximately between said two face directions. A considerable variability of the growth rate with the orientations lies in regions within 10° from the {111} crystal face directions and in regions within 5° from the {001} crystal face directions.

With a view to the differences in position of the various parts of the profiled surface a further consideration is to give the substrate surface an orientation which is at least 5° remote from said regions.

According to the invention, a method of manufacturing a semiconductor device, in particular a monolithic integrated circuit, in which highly doped zones are provided according to a given pattern on one side of a monocrystalline silicon substrate body by local diffusion of at least one impurity in a substantially flat surface of the substrate body and the substrate surface on said side is given a profile in a pattern which corresponds to the pattern of the highly doped zones, after which an epitaxial silicon layer is provided on said side, and one or more semiconductor circuit elements are then formed while using at least one photoresist step, is characterized in that the substantially flat substrate surface is given a crystal orientation lying between a {001} face and an adjacent {111} face, which orientation deviates at least about 10° from the said {001} face and at least about 15° from said {111} face and is present in a strip within about 10° from the crystallographic zone formed by the said two faces. A crystallographic zone formed by two crystal faces is to be understood to mean the collection of faces the lines of intersection of which extend parallel to the line of intersection of the said two crystal faces. The normals through all faces of said collection again lie in a plane the Miller indices [u, v, w] of which can be found from the indices $(h, k, l)$ and $(h', k', l')$ of the two crystal faces according to the formula $nu = kl' - k'l$, $nv = lh' - l'h$ and $nw = hk' - h'k$, where $n$ is a rational number differing from O and the largest common divider of the three values obtained from the subtractions. It is to be considered that the crystallographic zone $[u, v, w]$ is equal to $[\bar{u}, \bar{v}, \bar{w}]$. The crystallographic zone of the faces (001) and (111) can be indicated by the symbol $[\bar{1}10]$ or $[1\bar{1}0]$.

It is to be noted that such expressions in connection with comparisons of orientations with each other, such as "orientations far remote from each other" and also "regions of orientations" relate to pictures known in crystallography of orientations such as the most conventional stereographic projection of crystal faces, as dots in a flat plane. An angle between two orientations then becomes a line section and a continuous collection of orientations becomes a collection of dots which forms a region in the said flat plane of said projection.

It has furthermore been found that in some deposition methods sharp minima in the growth rates according to the {113} orientation can occur. These {113} orientations lie within the above given region. Considerable alteration of the growth rate with the orientation occurs in such a case only in a region within 2° from such a {113} face. Due to the small extent of said region, "shift" and "smear" need not always occur or the said phenomena will generally be restricted to the shift or disappearance of contour lines of the original profiled surface extending in a given direction. The picture may then be still sufficiently clear so as to recognize the location of buried diffusion zones. In general, however, it is recommendable to avoid disadvantageous results of strongly varying growth rates in the {113} orientation by choosing, according to a preferred embodiment, orientations in the said orientation region which are at least 7° remote from the {113} orientations.

Although pronounced minima in the growth rate with given crystal orientations of the monocrystalline substrate surface generally occur in epitaxial growth, it has been found that said minima are extra deep upon growing on a dislocation-free substrate. For example, in dislocation-free growth, such minima may cause the occurrence of strongly pronounced facets. As a result of this, the "shift" and "smear" phenomena may occur to an increased extent just in the case of dislocation-free epitaxy on a profiled substrate surface. Therefore, the method according to the invention is of particular importance when dislocation-free silicon is used.

It has furthermore been found that a pronounced minimum of the growth rate in {112} directions situated between {001} and the adjacent {111} directions may occur upon growing on dislocation-free silicon. In that case, considerable dependence of the orientation occurs only in a very small region within 1° from said {112} direction. In this case also, the possibility of the occurrence of restricted "shift" and "smear" phenomena may be acceptable, but it is recommendable in the case of dislocation-free growth to keep the orientation of the substrate surface at at least 6° from said {112} orientations.

It has already been said above that the growth rate between the {001} directions and the adjacent {111} directions outside the regions directly around the pronounced minima is only little dependent on the orientation. Said dependence is particularly minimal in the region of maximum growth rate.

It has been found that the growth rate shows such a maximum at each {115} orientation. At that area the maximum is very flat.

The growth rate generally shows few variations when the deviation from the {115} orientation is at most well over 15°, with the exception of orientation according to or adjacent {001} and possibly orientations according to or immediately adjacent the {113} face which encloses an angle of approximately 10° with the {115} face.

The substantially flat surface of the substrate body is preferably given an orientation according to a {115} face or a face which encloses an angle of at most 10° therewith. Of course, the part of the region should be excluded which deviates at most 10° from the nearest {001} face. If desired, the part of said region which deviates at most 7° from the {113} orientation may furthermore be excluded.

In this manner the orientations of edge portions of the profile remain sufficiently far remote from the known orientations with pronounced minima and the growth rates will generally not deviate substantially from the growth rate according to the main orientation of the substrate surface. As a result of this, the resulting profile of the surface of the epitaxial layer will generally give a reasonably correct indication of the location of the zones provided in the substrate by diffusion, so that a photomask used for a subsequent operation can safely be aligned on said profile.

For practical purposes for serering a grown crystal in discs according to parallel cutting planes and for further operations, such as etching and polishing, it suffices to choose a {115} orientation with a permissible tolerance of at most 3° deviating from said {115} orientation.

It is to be noted that for the present method according to the invention when using orientations of the substrate surface which lie in the proximity of a {115} face, similar advantages are obtained relative to {111} and {110} orientations, known when using {001} orientations, namely fewer surface states an suitable for etching narrow grooves by means of anisotropic etchants.

Since "shift" and "smear" phenomena in manufacturing epitaxial silicon semiconductor devices having buried zones are generally annoying, said phenomena are the more annoying according as thicker epitaxial layers are used. The use of the method according to the invention will be the more advantageous in the case of growth of the above thicker epitaxial layers, in particular epitaxial layers of at least $5\mu$, for example $8-15\mu$.

The invention will be described in greater detail with reference to the accompanying drawing.

Figure 7:
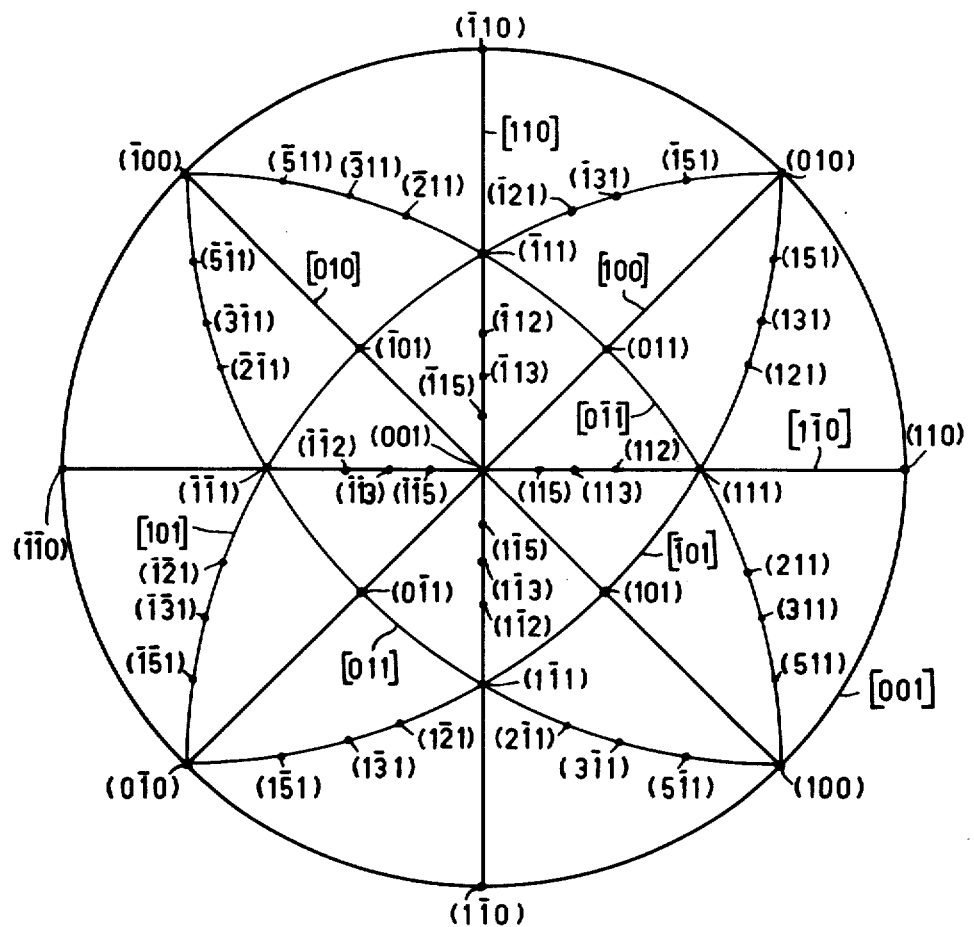
FIG. 7 is a stereographic projection of a silicon crystal in which a few crystallographic faces and crystallographic zones with Miller indices are indicated.

In the stereographic projection of FIG. 7 is shown the projection of half a silicon crystal having the (001) face in the center and bounded by the [001] zone. In the stereographic projection, crystal faces are denoted by dots corresponding to the position of the normal to such a crystal face. The normal to the (001) face is in this case perpendicular to the plane of the drawing. The zones are denoted as lines on which the dots indicating the crystal faces belonging to the zone are situated. In the stereographic projection said zones form circles or straight lines. The {111}, {001}, {110}, {112} {113} and {115} faces occurring on the said crystal half are shown in FIG. 7 as well as the <100> and the <110> zones, that is to say the [100], [010] and the [001] zone and the [110], [1$\bar{1}$0], [101], [10$\bar{1}$], [011] and the [0$\bar{1}$1] zone, respectively. For a good understanding of the present invention the <110> zones should be considered in particular.

Figure 9:
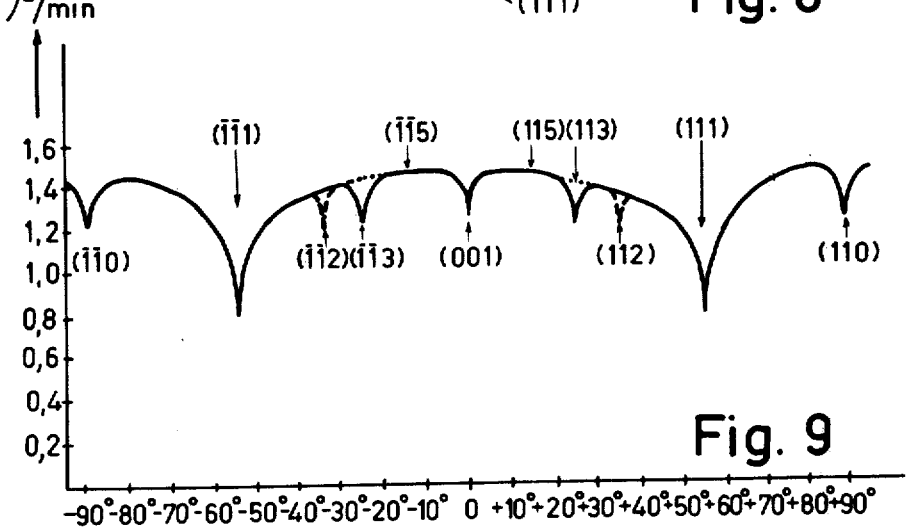
FIG. 9 shows diagrammatically in a graph velocities of epitaxial deposition on a monocrystalline silicon substrate in accordance with the crystal orientation of the substrate surface.

FIG. 9 shows diagrammatically in a graph the velocity of growth of an epitaxial silicon layer on a dislocation-free or dislocation-poor silicon substrate on surfaces having different orientations, which orientations are present on the same zone. In the present case the orientation of the surfaces belonging to the [1$\bar{1}$0] zone are plotted along the abscissa and that proceeding from the ($\bar{1}\bar{1}$0) face, via the ($\bar{1}\bar{1}$1) face, the (001) face and the (111) face to the (110) face. As O-point the (001) face has been chosen, in which the angle values in degrees measured from the (001) face are plotted negative in the direction of the ($\bar{1}$10) face and positive in the direction of the (110) face. The growth rate is plotted diagrammatically along the ordinate. The minima of the growth rate on the {113} faces are not always observed. The broken lines in FIG. 9 show diagrammatically the lack of such minima. Where dislocation-free substrate material is used, a minimum of the growth rate on the {112} faces may occur. Such minima are shown diagrammatically in broken lines. The solid-line curve shows diagrammatically the growth rate in the case of epitaxial deposition from silica tetrachloride and hydrogen at 1200° C. FIG. 9 shows the following aspects. A deep minimum at the area of {111} faces with in addition strong growth rate variation with orientation variation from said minimum. From the {111} faces in the direction of the {110} faces follows from 10° beyond the minimum of the {111} faces a less strongly inclined part over a distance of approximately 15° to a maximum of amply 10° from such a {110} face. Although this maximum is not sharp, the curve from said maximum to the relevant {110} face decreases comparatively rapidly to a minimum growth rate on said {110} face.

A very weakly inclining variation of the growth rate shows the curve for faces between the {111} orientations and the nearest {001} orientations, namely over a range of approximately 40° from a distance of approximately 10° from the relevant {111} orientation to approximately 5° from the relevant {001} orientation. Then follows a comparatively steep decline to a minimum according to the relevant {001} orientation. Shift phenomena are therefore small when growing is carried out on a profiled substrate surface which in the proximity of said range lies at at least 15° from the relevant {111} orientation and at least 10° from the relevant {001} orientation.

Figure 8:
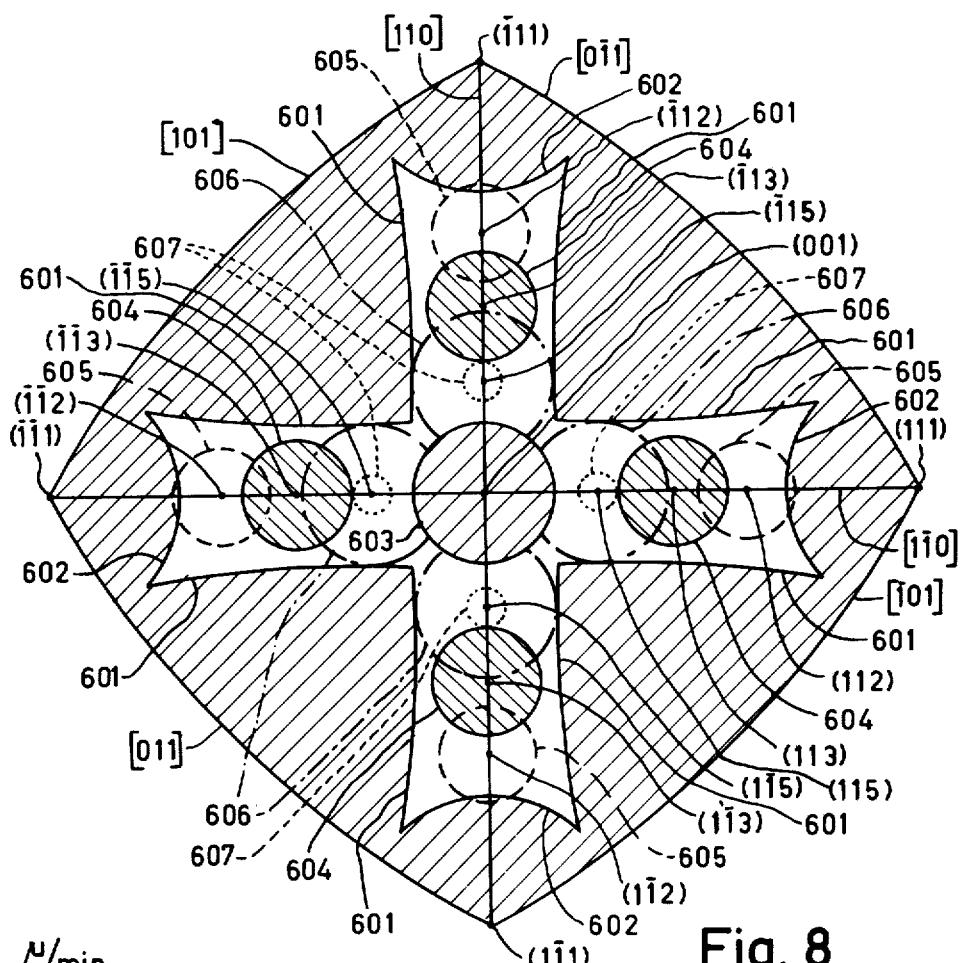
FIG. 8 shows a detail of said stereographic projection.

FIG. 8 is the part of the stereographic projection of FIG. 7 with the [0$\bar{1}$1], the [$\bar{1}$01], the [011] and the [101] zones as boundaries and the (001) face in the center. The corners of the Figure thus bounded are formed by the ($\bar{1}11$), (111), (1$\bar{1}$1) and ($\bar{1}\bar{1}$1) faces. Parts of the [110] and the [1$\bar{1}$0] zones are shown as straight lines intersecting each other in the (001) face between the ($\bar{1}$11) and the (1$\bar{1}$1) face and the ($\bar{1}\bar{1}$1) and the (111) face, respectively. Shown furthermore between the relevant {111} faces and the (001) face are the {112}, {113} and {115} faces present on said zone parts. The orientations between the (001) face and the adjacent {111} faces which are to be considered in the method according to the invention for the substrate surface, together form a kind of cross-like pattern in which the lines 601 denote the boundaries 10° on either side of the [110] and the [1$\bar{1}$0] zones. The lines 602 denote the boundaries formed by the distances of 15° from the relevant {111} faces. The hatched part outside the figure bounded by the lines 601 and 602 is not to be considered as a substrate orientation for the method according to the invention and neither is a similarly hatched region around the (001) face which is bounded by the circular line 603 present at a distance of 10° from the (001) face.

As is also shown in FIG. 9 with a minimum in the growth rate with adjacent strongly inclined curved parts, a minimum growth rate may also occur according to the {113} orientations. In order to avoid the possibility of picture disturbances in the epitaxial growth of the profiled substrate surface as a result of the growth phenomena in such orientations, according to a preferred embodiment, orientations within the circular hatched regions in FIG. 8 around the {113} faces denoted therein may be excluded from consideration for the substrate surface. The relevant regions are bounded by the circle outlines 604 which are present at 7° distance from the relevant {113} faces.

In the case of dislocation-free epitaxy, a minimum in the growth rate for the {112} faces may occur as is shown in FIG. 9 by broken-line sections. In order to avoid the possibility of picture disturbances in the epitaxial growth on the profiled surface of a monocrystalline dislocation-free silicon substrate, according to a further preferred embodiment, orientations within the circular regions enclosed in FIG. 8 by broken lines 605 around the {112} faces shown therein may be excluded from consideration for the substrate surface. The relevant broken lines 605 lie at a distance of 6° from the relevant {112} faces.

FIG. 9 shows substantially flat parts of the curve near the {115} orientations. The growth rate does not substantially vary here with the orientation. The choice of preferred orientations within a given distance from a {115} orientation, as already described above, are based inter alia on the approximate invariance of the growth rate with the orientation in the relevant area. These preferred orientations are shown in FIG. 8. For example, wider preferred regions around the {115} orientations are bounded by the dot-and-dash lines 606 at 10° from the {115} orientation and adjoining parts of the line 603 at 10° from the adjacent {001} orientations in which, if desired, overlapping regions to 7° distance from the adjacent {113} orientations may be left out of said preferred choices. The {115} orientations with a tolerance to 3° from such an orientation, as may be chosen in practice, according to an already mentioned preferred embodiment, are shown in FIG. 8 by circular regions which are bounded by broken lines 607.

It will now be described with reference to FIGS. 1 to 4 how, with various orientations of the surface of a silicon substrate body of which a silicon layer is deposited epitaxially, a profile provided in said substrate manifests itself in a possible profile of the surface of the provided epitaxial layer.

Figure 1:
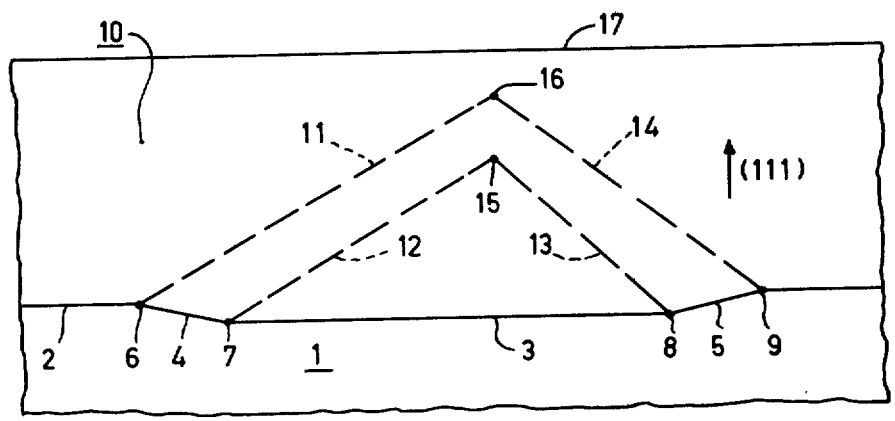
FIG. 1 is a diagrammatic cross-sectional view of an epitaxial silicon layer grown on a profiled substrate surface according to a {111} orientation.

Reference numeral 1 in FIG. 1 denotes a substrate of monocrystalline silicon having a surface 2 which is oriented exactly according to the (111) face. The direction of the normal to the (111) face is denoted in FIG. 1 by an arrow.

The substrate surface is profiled, namely a part 3 having the same (111) orientation is present slightly deeper in the substrate. On either side of the surface part 3, edge parts 4 and 5 are present which form the junction with the higher parts of the substrate surface 2. These edge parts which need not be entirely flat, enclose a small average angle with the adjacent parts, for example, from 5° to 10°. Said edge parts thus also enclose the same angle with the said {111} face. Such a profile can be obtained in forming a diffused zone at the area of the surface part 3 in an oxidizing atmosphere and with the use of a mask on the adjacent parts, for example, of silicon oxide or silicon nitride. The profile in the silicon substrate surface is formed by additional oxidation of the silicon in the window of the mask. After removing the mask and the oxide formed in the windows, the profile pattern with the deeper located parts where the windows were provided in the mask is clearly visible.

The resulting edge parts 4 and 5 generally have slightly rounded transitions with the adjacent flat equally oriented parts, namely with the higher situated parts, the transitions 6 and 9, respectively, with salient angle and with the deeper part 3 the transitions 7 and 8, respectively, with re-entrant angle.

When silicon is epitaxially deposited on such a surface, the growth in the (111) direction will be slower than in directions deviating therefrom. Places with re-entrant angles (7 and 8) will move in the direction of the slowest growing face and places having a salient angle (6 and 9) will displace away from the slowest growing face. The edge faces 4 and 5 grow towards each other. The broken lines 11, 12, 13 and 14 denote diagrammatically the displacement of the transitions 6, 7, 8 and 9, respectively, during the epitaxial growth of silicon. The possibility exists that in the case of continued growth the profile shown disappears in that the transitions 7 and 8 reach each other in a place which is denoted diagrammatically by 15 and subsequently the transitions 6 and 9 reach each other at 16, the edge zones 4 and 5 having also disappeared. As a result of this, the ultimate surface 17 of the epitaxial layer 10 shows no traces any more of the original profile 4, 3, 5 of the substrate surface 2 so that no visible indication is present any longer of the location of a buried layer provided by diffusion at the area of the profile 4, 3, 5. A photomask to be used afterwards for the manufacture of one or more planar semiconductor devices can no longer be aligned on visible indications of the presence of a buried layer.

It is to be noted that the disappearance of the profile in the said exact orientations need not necessarily take place by the above-described mechanism. Actually, with such an exactly oriented surface, only a single atom layer is present at the whole surface. On this layer a new atom layer should be deposited in the epitaxial growth. For that purpose, first a nucleation process should take place in which depositions are formed on the layer present in only a few places said deposits consisting of separate atoms or very small groups of atoms which subsequently start growing laterally. This nucleation process has a considerably delaying influence on the growth mechanism. With such an exact orientation over a large surface the growth rates might be considerably lower than the minima denoted in the curve of FIG. 9. This situation applies to the higher situated part of the surface 2 in FIG. 1. The beginning of subsequent atom layers at the deeper located part 3 is already present at the edge parts 4 and 5. From there these atom layers may immediately grow laterally. The result is that the deeper the surface part 3 with {111} orientation grows much more quickly than the higher located surface parts having {111} orientation until the profile is entirely filled.

It is to be noted that the disappearance of a profile in the epitaxial growth on an exact {111} face has also been observed in the epitaxial growth on exact {110} and {001} faces.

Figure 2:
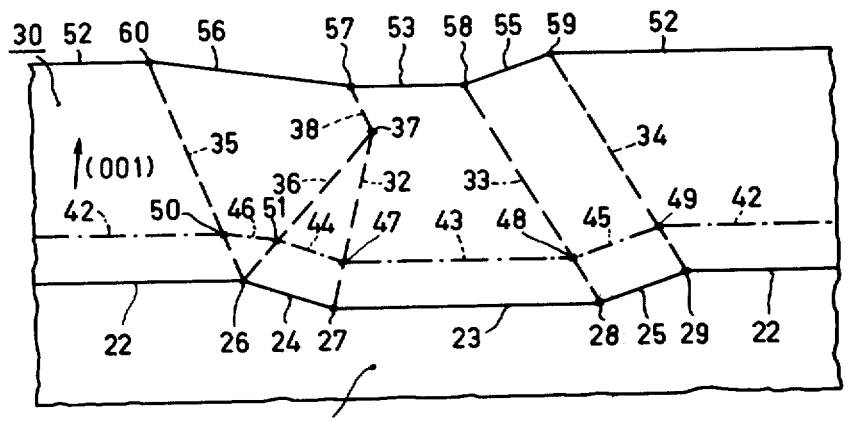
FIG. 2 is a diagrammatic cross-sectional view of an epitaxial silicon layer grown on a profiled substrate surface having an orientation which deviates from a {001} face by an angle smaller than 5°.
Figure 3:
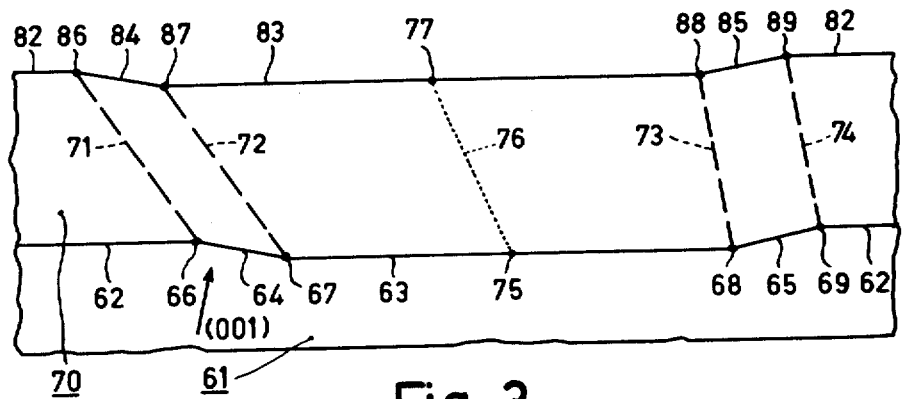
FIG. 3 is a diagrammatic cross-sectional view of an epitaxial silicon layer grown on a profiled substrate surface having an orientation which deviates from a {001} face by approximately 5°.

It is generally very difficult to obtain slices having exact {111}, {110} or {001} faces. Furthermore it is known that, possibly associated with said very slow growth rates on said exactly oriented faces, epitaxial layers of a better quality can be obtained when substrate surfaces are chosen which deviate from such an exact orientation over a very small angle, for example, 2° – 4°. In general it is hardly possible or at least very expensive to manufacture slices having a very special accurate orientation in series production in a reproducible manner. FIGS. 2 and 3 show two cases of substrate surfaces deviating in certain manners from an exact {001} face.

Reference numeral 21 in FIG. 2 denotes a monocrystalline silicon substrate the surface 22 of which has an orientation which deviates 2° from the (001) face. An arrow in FIG. 2 denotes the direction of the normal to the (001) face. The surface is profiled and has a deeper located surface part 23 having the same deviating orientation.

The deeper surface part 23 is bounded by edge parts 24 and 25 which form the transition to the higher located parts of the surface 22 and which each enclose an angle of on an average approximately 5° with the higher and lower flat surface parts. The edge part 24 deviates from the (001) orientation towards a side opposite to the deviation of the adjoining lower and flat surface parts and encloses an angle of on an average 3° with the (001) face.

The edge part 25 deviates towards the same side of the (001) face as the part 23 of the surface, but with a larger angle, namely on an average 7°.

In the case of epitaxial deposition of silicon on the thus profiled substrate surface, the growth will be most rapid on the surface parts which deviate most from the (001) orientation. For example, the edge part 25 which deviates on an average 7° from the (001) orientation will grow more rapidly than the adjoining surface parts which deviate only 2° from the (001) orientation. The edge part 25 will hence move in the direction of the deeper surface part 23, the transitions 28 (with reentrant angle) and 29 (with salient angle) with the adjoining deeper located surface part 23 and the adjoining higher situated part of the surface 22, respectively, moving as is shown diagrammatically by the broken lines 33 and 34, respectively.

The edge part 24 which encloses an average angle of 3° with the (001) face will grow more rapidly than the surface part 23 which encloses an angle of 2° with the (001) face. However, the growth rate on the edge part 24 will not be so large as the growth rate on the edge part 25. The boundary 27 between the surface part 23 and the edge part 24 during the growth will hence move laterally less strongly in the direction of the surface part 23 than the transition 28. The movement of the transition 27 is denoted by the broken line 32.

At the transition 26 a new edge part which may be more or less flat with an average orientation according to the (001) face is now formed by the minimum growth rate in the (001) direction. The boundary between said new edge part and the adjacent highest located surface part during the growth moves from point 26 along a line which is shown diagrammatically in FIG. 2 by the broken line 35. The lateral displacement occurs in the direction of the adjacent highest located surface part.

The transition from said new edge part with the more rapidly growing edge part 24 already present moves laterally from 26 in the direction of the edge part 24 along the broken line 36.

The dot-and-dash line 42 shows diagrammatically the surface in an intermediate stage of the epitaxial deposition. The deepest part 43 has become smaller than the original surface part 23. Furthermore, the face center of part 43 has moved relative to the face center of the original part 23 in that the boundary 48 has moved laterally considerably more relative to the original boundary 28 than the boundary 47 relative to the original boundary 27. The edge part 45 with the boundaries 48 and 49 has moved laterally considerably relative to its original location 25 with the corresponding boundaries 28 and 29, respectively.

On the other side of the deeper located surface part 43, two juxtaposed edge parts are formed between said part 43 and the high part of the surface 42, namely the part 44 which has been formed by growth on the edge part 24, and a freshly formed part 46 which is oriented on an average according to the (001) face. The edge part 44 encloses an angle of approximately 5° with the deeper located surface part 43 and a transition 47 which has undergone comparatively little displacement relative to the original 27.

Due to the comparatively slow growth in the (001) direction the edge part 46 has obtained a considerable width in which the boundary 51 with the edge part 44 has moved laterally relative to the transition 26 more considerably than the transition 47 relative to the transition 27. The width of the edge part 44 has reduced relative to the original width of the edge part 24. Whereas at the transition 47, 48 and 49 the adjoining surface parts enclose angles of approximately 5° with each other, said angles at the transitions 50 and 51 are only 2° and 3°, respectively. As a result of this, the said transitions are hardly visible in contrast with the transitions between faces of approximately 5°.

In the case of continued epitaxy, the edge part 24–44 will have disappeared at the area where the broken lines 32 and 36 meet at 37. The deeper surface part 23–43 from the place 37 will adjoin the further grown (001) face 46 with which it encloses an angle of 2°. The relevant transition will extend along the broken line 38.

The surface 52 of the epitaxial layer 30 after the epitaxial deposition has a deeper situated surface part 53 as a continuation of the original surface part 23 but its width is much smaller. On one side adjoins an edge part 55 as a continuation of the edge part 25 but displaced laterally considerably relative to the same. This edge part 25 which encloses angles of approximately 5° with the higher situated part of the surface 52 and with the lower situated part 53 forms clearly visible transitions 59 and 58, respectively, with said face parts.

Present on the other side of the deeper situated surface part 53 between said part and the higher part of the surface 52 is a wide edge zone 56 inclined with an angle of only 2° and having (001) orientation the transitions 57 and 60 of which are substantially not visible any longer (so-called "smear").

It is obvious from the above that the recognition of the location of the buried layer at the area of the original deeper situated surface part 23 with reference to the observed profile of the surface 52 is difficult due to said so-called "smear", while the exact location of the transitions 58 and 59 relative to the original transitions 28 and 29 is subsequently extremely inaccurate due to the occurred "shift".

FIG. 3 shows diagrammatically the further growth of a profile in the face in which the monocrystalline silicon substrate surface 62 deviates approximately 5° from the (001) face. The (001) direction, that is to say the direction of the normal to the (001) face, is denoted by an arrow.

In known manner a buried zone is formed in the substrate 61 by local diffusion, a profiled surface being obtained having a deeper situated surface part 63 at the area of the formed buried zone.

Between the deeper situated surface part 63 and the higher situated parts of the substrate surface 62 present on either side thereof, edge parts 64 and 65 are formed the orientation of which differs on an average approximately 5° from the higher and lower situated surface parts. The edge part 64 is oriented substantially according to the (001) face, while the edge part 65 deviates approximately 10° from the (001) face. In FIG. 3 the transitions of the edge part 64 with the adjoining higher situated part of the substrate surface 62 and with the lower situated surface part 63 are denoted by 66 and 67, respectively. The transitions of the edge part 65 with the lower situated surface part 63 and with the adjoining higher situated part of the substrate surface 62 are denoted by 68 and 69, respectively. FIG. 3 shows again diagrammatically how the profile in the substrate coninues upon deposition of an epitaxial layer 70. Since the growth rate in the (001) direction has a minimum, the edge part 64 will grow most slowly. The higher situated parts of the surface 62 and the deeper surface part 63 which deviate 5° from the (001) face will grow more rapidly than the edge part 64.

As a result of this, during the growth the transition 66 will move laterally considerably in the direction of the adjoining higher situated part of the surface 66, as is shown diagrammatically by the broken line 71. The transition 67 will move laterally approximately equally strongly in the direction of the edge part 64 as is shown diagrammatically by the broken line 72.

The growth of the edge part 65 which deviates 10° from the (001) face is only little faster than the growth on the adjoining surface parts which deviate 5° from the (001) face. As a result of this the transitions 68 and 69 will move only slightly laterally in the direction of the lower situated surface part 63 and of the edge part 65, respectively, as is denoted by the broken lines 73 and 74, respectively.

Upon comparing the profile in the ultimately obtained surface 82 of the epitaxial layer 70 with the original profile in the substrate surface 62 the following is to be remarked.

The resulting edge part 85 with its boundaries 88 and 89 has moved only slightly laterally in the direction of the adjoining deeper situated surface part relative to the original edge part 65 with its boundaries 68 and 69, respectively. The resulting edge part 84 with its boundaries 86 and 87 on the other side of the resulting deeper situated surface part 83, however, has moved laterally considerably in a direction away from the deeper surface part relative to the original edge part 64 with transitions 66 and 67, respectively. As a reslut of this the center 77 of the deeper situated surface part 83 has moved laterally with respect to the center 75 of the original deeper situated surface part 63. The displacement of said center during the epitaxial deposition is shown diagrammatically in FIG. 3 by the broken line 76. In this manner a lateral shift of the original profile has been obtained which causes a wrong alignment of a photomask for further manufacturing steps in the manufacture of semiconductor devices relative to previously provided buried zones.

With reference to FIGS. 1 to 3 examples have been given above of possibilities of lateral displacement and/or fading of profiled patterns in a substrate surface after epitaxial deposition and these phenomena have been described with respect to special orientations. Since the growth rate varies considerably with the orientation of the face it is obvious that variations in the orientation in the cases described often go hand in hand with remarkable changes in the extent of shift of the profile and/or with the occurrence or non-occurrence of fadings in the visibility of the profile (smear).

It is possible, as has been described with reference to FIG. 1, that after epitaxy no profile at all or only a very small profile is visible so that a normal alignment on buried zones in the substrate is no longer possible. When a part of the treated wafers with epitaxial layer has such a surface, such wafers can no longer be used any further. When wafers occur with surface profiles having a partial fading, said wafers, when a large number of wafers having the same pattern is offered, may be further investigated so as to establish how this pattern can possibly have formed from the original substrate profile. It is obvious that such an investigation requires extra work and expenses and may even produce a stagnation in the production.

In order to compensate for non-reproducibility due to shift phenomena, such shifts should be taken into account when designing an assembly of semiconductor circuit elements and the location of isolation zones by choosing wide margins. For example, when a provided buried layer in a circuit element to be provided should serve to reduce the lateral resistance of a zone of the epitaxial layer present below a diffusion zone provided in the epitaxial layer, and possibly to connect it to a contact zone provided beside said zone, said buried zone should be chosen to be so wide that with any possible shift the said diffusion zone provided in the epitaxial layer and the contact zone provided beside it will everywhere be present in a vertical position above the buried zone. An example of such a circuit element is a planar transistor in a monolithic integrated circuit having a base and emitter zone diffused in the epitaxial layer, the buried zone below the base zone serving to reduce the collector series resistance, said buried zone also extending below a low ohmic collector contact zone. Upon designing an isolation zone to be used around the relevant circuit element which should remain at a safe distance from the buried zone, not only the factor that the buried zone has been given larger dimensions should be taken into account but also the factor that the location of the buried zone is not accurately known. As a result of these two factors a double margin should be considered for the isolation zone. As a result of this the surface of the semiconductor which is necessary for a certain semiconductor device, for example, a certain integrated circuit should be chosen to be larger in connection with the said margins. As a result of this the number of semiconductor devices to be manufactured from a semiconductor wafer of given dimensions is adversely influenced.

Figure 5:
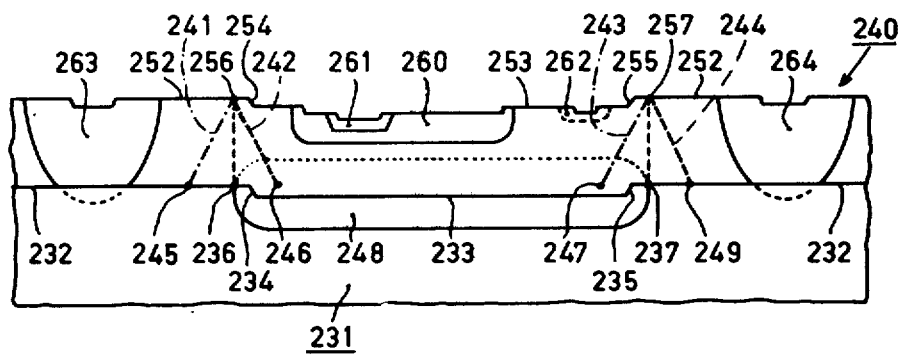
FIG. 5 is a diagrammatic cross-sectional view of a detail of a bipolar monolithic integrated circuit which has been manufactured in known manner.

FIG. 5 shows a detail of an integrated circuit in which a planar transistor configuration is provided in an island, which is laterally bounded by diffused isolation zones. The oxide layers and metal strips normally present are not shown.

According to conventional methods there is locally provided in a monocrystalline silicon substrate 231 of a given conductivity type, for example high ohmic p-type, a highly doped zone 248 of the opposite conductivity type, for example, an arsenic-doped low-ohmic n-type zone, by means of planar diffusion methods. The substrate surface 232 obtains a profile having a deeper situated part 233 which is bounded by edge zones 234 and 235.

An epitaxial silicon layer 240 is then grown by means of known methods. This silicon is of a conductivity type opposite to that of the substrate and has a comparatively high resistivity. The diffusion zone 248 formed in the substrate becomes a buried zone which is low-ohmic with respect to the epitaxially provided material. In the case in which no so-called "smear" occurs, the profile of the substrate surface 232 manifests itself again as a similar profile in the surface 252 of the epitaxial layer 240. For example, the surface 252 has a deeper situated part 253 with edge parts 254 and 255, corresponding to the deeper situated part 233 with edge parts 234 and 235, respectively, of the substrate surface 232. The resulting profile is then used for aligning photomasks to form diffusion masking patterns for diffusion steps to be carried out subsequently. Said diffusion steps consist of a deep separation diffusion to form separation zones 263 and 264 which are of the same conductivity type as the substrate and extend down to the substrate, for example, a boron diffusion, so as to obtain in the epitaxial layer 240 a division into islands of a conductivity type opposite to that of the substrate 231.

A less deep base diffusion is then carried out above the buried layer 248, for example, also a boron diffusion but shorter than the diffusion to form the isolation zones 263 and 264. A base zone 260 is formed of the same conductivity type as the substrate. By means of an emitter diffusion, for example, by local diffusion of phosphorus, an emitter zone 261 in the base zone 260 and a low-ohmic collector contact zone 262 are provided both of a conductivity type opposite to that of the substrate 231. The epitaxially provided material adjoining the base zone now forms the collector zone of the transistor, said collector being connected to a collector contact (not shown) which is provided on the zone 262. The buried zone 248 serves to reduce the collector series resistance.

FIG. 5 shows the case in which no so-called "shift" occurs, that is to say that the deeper situated part 253 of the surface 252 of the epitaxial layer 240 would be situated straight above the deeper situated part 233 of the substrate surface 232. By lateral diffusion during the formation and expansion of the buried zone 248, said zone obtains a lateral expansion from the edge parts 234 and 235 of the substrate surface to the boundaries 236 and 237, respectively. Said lateral expansion of the buried zone 248 can be determined beforehand in dependence on the temperature treatments to be used. Assuming that no "shift" has occurred, the location of the points 256 and 257 can also be determined which would be present straight above the lateral boundaries 236 and 237 of the buried zone 248. The location of said points 256 and 257 in fact is correlated in such a case to the location of the edge parts 254 and 255, respectively, of the profile in the surface 252 of the epitaxial layer, and actually the distance of each of the said points to the nearest edge part is the same.

Given the requirement that the buried zone should extend below the whole base zone 260 and the whole collector contact zone 262 and that furthermore the previously chosen proportioning of the transistor, as far as the lateral dimensions of the assembly are concerned, formed by the base zone plus the collector contact zone plus the intermediately located region, is fixed, the lateral dimensions of the buried zone 248 will be chosen to be so that while maintaining said conditions, said dimensions are minimized so as to make the lateral dimensions of the silicon part to be used for one semiconductor device as small as possible and hence the number of semiconductor devices to be manufactured from one semiconductor wafer of given dimensions as large as possible.

However, in order to satisfy the above mentioned conditions, the occurrence of "shift", that is to say a lateral shift of the surface profile, should be taken into account. Hence that, as shown in FIG. 5, the lateral dimensions of the buried zone 248 are chosen to be considerably larger than the lateral dimensions of the assembly formed by the base zone 260, the collector contact zone 262 and the intermediately located region. Actually, the points 256 and 257 need not be situated straight above the boundaries of the buried zone 248, that is to say the points 236 and 237 may be shifted relative to the actual boundaries of the zone 248. The fact should be taken into account that a maximum shift, either to one side, for example, according to a direction denoted by the dot-and-dash lines 241 and 243, or to the other side, for example according to a direction denoted by the broken lines 242 and 244 can have taken place. In the former case the actual boundaries of the buried zone lie at 245 and 247, in the latter case at 246 and 249. In the second extreme case the boundary 246 should still be situated sufficiently far to the left when viewed in FIG. 5 in order that the buried zone will be present entirely below the base zone 260. In the former case the boundary 247 should be situated sufficiently far to the right when viewed in FIG. 5 in order that the buried zone extend below the base contact zone 262.

The separation diffusion zones 263 and 264, as well as the diffusion zones 260, 261 and 262, are aligned to the profile pattern 254–253–255. Inter alia in connection with breakdown and shortcircuit between adjacent islands, said zones should remain at a reasonable distance from the buried zone 248. Since, however, the position of the buried zone is not certain, the isolation zone 263 should be kept at a safe distance from the buried zone in its possible extreme left position, when viewed in FIG. 5, that is to say at a sufficient distance from the point 245. For the same reason the isolation zone 264 should be present at a safe distance from the buried zone in its possible extreme right position, when viewed in FIG. 5, that is to say at a sufficient distance from the point 249. This means that the possibility of the occurrence of shift has for its result that with the dimensions of the island with the transistor, as shown in FIG. 5, the occurrence of lateral shift of the profile should be taken into account twice, namely once by a widening of the lateral dimensions of the buried zone and once again for a sufficient distance of the isolation zone to the buried zone, taking into account the uncertainty about the correct position of same. The distance between the isolation zone 263 and the base zone 260 on the one hand and between the isolation zone 264 and the collector contact zone 262 on the other hand is much larger than would normally be necessary for a good safety in connection with shortcircuit between base zone and isolation, and breakdown between collector contact zone and isolation, respectively.

Figure 4:
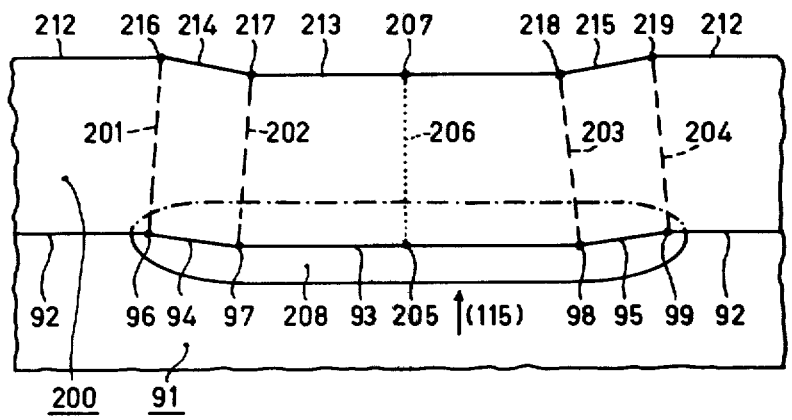
FIG. 4 is a diagrammatic cross-sectional view of an epitaxial silicon layer grown on a profiled substrate surface having an orientation as may be used in the method according to the invention.

FIG. 4 shows diagrammatically the growth of an epitaxial layer on a profiled surface with an orientation, as should be used in the method according to the invention, for example, approximately according to the (115) face. An arrow indicates approximately the (115) direction.

In a monocrystalline silicon substrate 91 whose surface 92 has thus been oriented there is locally diffused by means of known planar diffusion methods a suitable impurity to form a buried doped zone 208, for example, of a conductivity type opposite to that of the substrate 91. In this process silicon is oxidized at the area of the formation of the diffusion zone 208 so that a profile is obtained having a deeper situated surface part 93 bounded by edge parts 94 and 95 which on an average enclose an angle of approximately 5° with said deeper situated part 93 and the adjoining higher situated parts of the surface 92. The diffusion masks and oxide layers used which are formed during the diffusion are etched away so that the silicon substrate surface is exposed. The profile in the surface 92 denotes the location of the diffusion zone 208.

An epitaxial layer 200 of silicon is then deposited in known manner. Since the orientation of the substrate surface has now been chosen favourably, the growth rates in directions perpendicular to the edge parts 94 and 95 are mutually substantially the same and also substantially equal to the growth rates perpendicular to the adjacent higher parts of the surface 92 and on the lower situated surface part 93. The growth rates in intermediately located directions are also the same so that the formation of differently oriented surfaces, as described with reference to FIG. 2, does not occur.

Since all the surface parts grow substantially equally rapidly, the lateral displacements of the transitions between adjacent surface parts with mutually different orientations are also substantially negligible. The edge part 94 forms transitions 96 and 97 with the adjoining higher part of the substrate surface 92 and with the deeper situated surface part 93, respectively. The edge part 95 forms transitions 99 and 98 with the adjoining higher part of the substrate surface 92 and with the deeper situated surface part 93, respectively.

The displacements of the transitions 96, 97, 98 and 99 during the epitaxial deposition are denoted by the broken lines 201, 202, 203 and 204, respectively, while the displacement of the center 205 of the deeper situated surface part 93 is denoted by the broken line 206.

After the deposition of the epitaxial layer 200, the surface 212 not only has substantially the same profile as the original substrate surface 92, but the profile of the surface 212 has also substantially not shifted laterally relative to the profile of the original substrate surface 92. The transitions 216, 217, 218 and 219 between mutually differently oriented parts of the surface 212 which corresponds to the transitions 96, 97, 98 and 99, respectively, of the substrate surface 92 are also present substantially straight above the last-mentioned corresponding transitions. The deeper part 213 of the surface of the epitaxial layer has substantially the same shape and size as the original deeper part 93 of the substrate surface, the center 207 of the deeper part 213 being present straight above the center 205 of the corresponding deeper part 93 of the substrate surface. The edge parts 214 and 215 of the surface 212 of the epitaxial layer 200 are also present substantially straight above the corresponding edge parts 94 and 95, respectively, of the substrate surface 92.

Monocrystalline silicon substrate bodies may be used in series production, in which the substrate surface of the various silicon bodies may differ mutually in their orientation relative to the crystal lattice of the monocrystalline substrate provided they are maintained within the boundaries to be used in the method according to the invention. The profiles in the surface of the epitaxial layer in all these silicon bodies will be substantially equal to the profiles in the original substrate surfaces, namely the corresponding profiles will always be present substantially straight above each other. The location of previously provided buried zones may be accurately determined herefrom with reference to the profile in the surface of the epitaxial layer in each wafer. Not only in this manner is contour fading (smear) counteracted, but also any uncertainties about the location of buried layers by uncontrollable profile shifts are not involved in designing an integrated circuit. Advantages hereof, in particular the possibilities of a more compact structure, will be explained with reference to FIG. 6.

Figure 6:
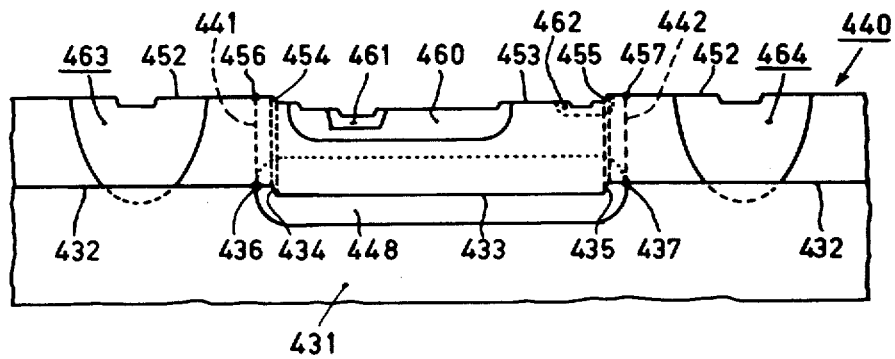
FIG. 6 is a diagrammatic cross-sectional view of a detail of a bipolar monolithic integrated circuit, manufactured according to an embodiment of the method according to the invention.

FIG. 6 relates to a part of an integrated circuit having islands formed in an epitaxial layer which are separated from each other by separation diffusion, in which semiconductor circuit elements are provided in said islands. In FIG. 6 a transistor of the type of the transistor shown in FIG. 5 is formed in such an island. The oxide layers and metal strips which are normally present are not shown in FIG. 6. For a good comparison between FIG. 5 and FIG. 6 the transistors shown in said Figures are identical as regards the size and shape of the emitter zone, the base zone, the collector contact zone and the region between the collector contact zone and the base zone, as well as their mutual location. The manufacture also comprises similar steps. However, the semiconductor device of which FIG. 6 shows a detail is manufactured according to an embodiment of the method according to the invention.

Starting material is a monocrystalline silicon substrate body 431 of a given conductivity type, for example high-ohmic p-type, whose surface 432 is oriented as can preferably be used in the method according to the invention in that the orientation of said face deviates not more than 10° from a {115} face and deviates at least 10° from the {001} face which encloses the smallest angle with the said {115} face. This small angle is approximately 15°. The orientation of the substrate surface preferably deviates also at least 7° from the {113} face which encloses the smallest angle with the said {115} face. This smallest angle is approximately 10°. A substrate surface may be used which is oriented approximately according to a {115} face, and which, for example, deviates not more than 3° from said orientation.

A highly doped zone 448 of a conductivity type opposite to that of the substrate and present at the substrate surface 432 is formed locally according to conventional methods by planar diffusion, for example, an n-type zone is formed by the local diffusion of arsenic. The substrate surface obtains a profile having a deeper situated part 433 bounded by edge zones 434 and 435.

An epitaxial silicon layer 440 is then grown by known methods. The silicon of said layer is of a conductivity type which is opposite to that of the substrate 431 and has a comparatively high resistivity. The diffusion zone 448 formed in the substrate becomes a buried zone which is low ohmic relative to the epitaxially provided material. The profile of the substrate surface 432 again manifests itself as a substantially identical profile in the surface 452 of the epitaxial layer 440. For example, the surface 452 has a deeper situated part 453 with edge parts 454 and 455 corresponding to the deeper situated part 433 with edge parts 434 and 435, respectively, of the substrate surface 432. The resulting profile is then used for aligning photomasks to form diffusion mask patterns for diffusion steps to be carried out afterwards. Said diffusion steps consist of a deep separation diffusion for the formation of separation zones 463 and 464 which extend down to the substrate and are of the same conductivity type as the substrate, for example a boron diffusion, in order to obtain in the epitaxial layer a division into islands of a conductivity type opposite to that of the substrate.

A less deep base diffusion is then carried out above the buried layer 448, for example, also a boron diffusion, but shorter than the diffusion to form the isolation zones 463 and 464. The base zone 460 is formed having the same conductivity type as the substrate. By means of an emitter diffusion, for example, by indiffusion of phosphorus, an emitter zone 461 in the base zone 460 and a low-ohmic collector contact zone 462 are provided, both of a conductivity type opposite to that of the substrate 431. The epitaxially provided material adjoining the base zone now forms the collector zone of the transistor, said collector being connected to a collector contact (not shown) provided on the zone 462. The buried zone 448 serves to reduce the collector series resistance.

The above-described operations correspond to the method steps described with reference to FIG. 5. However, as regards the proportioning and localisation of the various regions the occurrence of shift need no longer be taken into account. For example, it may be relied upon that, also in the case of variation of the orientation within the above-denoted boundaries, the edge parts 454 and 455 which bound the deeper situated surface part 453 will be present substantially straight above the original edge parts 434 and 435, respectively, of the original substrate surface. This means that the lateral dimensions of the buried layer 448 may now be restricted substantially to the lateral dimensions of the part of the transistor formed by the base zone 460, the collector contact zone 462 and the region present between said two zones. In the case shown in FIG. 6 a diffusion mask is used for the formation of the buried zone 448, which mask has a window which had substantially equally large dimensions as the lateral dimension of the above-mentioned part of the transistor to be manufactured afterwards. As a result of lateral diffusion, the buried zone extends laterally to the boundaries 436 and 437 of which it may be said with rather great accuracy that they will be present substantially straight below the places 456 and 457, respectively, which places are present at a distance from the edge parts 454 and 455, respectively, which can be previously determined.

For the location of the separation diffusion zones 463 and 464, one has to take an account of a buried zone 448 which in this case, however, has smaller lateral dimensions than the buried zone 248 of FIG. 5. Furthermore, a substantially accurately known location of said buried zone 448 may be relied on. As a result of this, the space between the saturation diffusion zone 463 and the base zone 460 and the space between the separation diffusion zone 464 and the collector contact zone 462 may be chosen to be much smaller than the corresponding distances between the zones 263 and 260 and between the zones 264 and 262, respectively, of the semiconductor device shown in FIG. 5. In the case shown in FIG. 6, a compactness may now be obtained in which limits are imposed by the possibility of undesired interaction between zones present at the surface of the island and the separation diffusion zones. Upon comparing FIG. 6 to FIG. 5 it is obvious that, with the method according to the invention, for the same semiconductor circuit element with buried diffusion zone in a monolithic integrated circuit islands having smaller lateral dimensions may be used than in integrated circuits manufactured in known manner. It is furthermore obvious that as a result of this more epitaxial semiconductor devices having buried zones and having given specifications can be manufactured from one semiconductor wafer than with known methods in which "shift" is to be taken into account. Furthermore, difficulties as a result of the occurrence of "smear" are avoided.

The chosen orientations are nevertheless present comparatively close to {001} orientations. Known advantages of {001} orientations relative to other usual orientations as {110} and {111} orientations prove to hold also for orientations used according to preferred embodiments of the invention. For example, by means of anisotropic etchants, mutually perpendicular or substantially perpendicular grooves may be etched in the surface having steep walls which are oriented according to {111} faces. Due to the large angles between the chosen surface orientations and the {111} faces deep grooves of a small width can be obtained. Furthermore, the surface properties in planar structures prove to be not significantly different from the known favourable surface properties of {001} surfaces in planar structures.

What is claimed is:

1. A method of manufacturing a semiconductor device, in particular a monolithic integrated circuit, in which highly doped zones are provided according to a given pattern on one side of a substantially dislocation free monocrystalline silicon substrate body by local diffusion of at least one impurity in a substantially flat surface of the substrate body and the substrate surface on said side is given a profile in a pattern which corresponds to the pattern of the highly doped zones, after which an epitaxial silicon layer is provided on said side and one or more semiconductor circuit elements are then formed while using at least one photoresist step, characterized in that the substantially flat substrate surface is given a crystal orientation lying between a {001} face and an adjacent {111} face, an {113} face being present between said {001} and {111} face, which orientation deviates at least 10° from the said {001} face, at least 15° from said {111} face, and at most 10° from a {115} face and is present in a strip within 10° from the crystallographic zone formed by the said {001} and {111} faces, said substrate surface enclosing an angle of at least 7° with said {113} face.

2. A method as claimed in claim 1, characterized in that the substrate surface has an orientation which deviates at most 3° from a {115} face.

3. A method as claimed in claim 1, wherein an epitaxial layer is grown in a thickness of at least 5µ.

* * * * *